(12) United States Patent
Hsu et al.

(10) Patent No.: US 11,165,190 B2
(45) Date of Patent: Nov. 2, 2021

(54) WATERPROOF SEALING RING AND WATERPROOF CONNECTOR INCLUDING THE SAME

(71) Applicant: Cheng Uei Precision Industry Co., LTD., New Taipei (TW)

(72) Inventors: Li-Nien Hsu, New Taipei (TW); Sheng-Nan Yu, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/900,984

(22) Filed: Jun. 14, 2020

(65) Prior Publication Data

US 2021/0167544 A1    Jun. 3, 2021

(30) Foreign Application Priority Data

Dec. 3, 2019   (CN) .......................... 201922138988.9

(51) Int. Cl.
   *H01R 13/52*   (2006.01)
   *H01R 43/24*   (2006.01)
   *H05K 5/06*    (2006.01)

(52) U.S. Cl.
   CPC ..... *H01R 13/5202* (2013.01); *H01R 13/5219* (2013.01); *H01R 43/24* (2013.01); *H05K 5/069* (2013.01)

(58) Field of Classification Search
   CPC ............ H01R 13/5202; H01R 13/5219; H01R 43/24; H05K 5/069
   USPC .......................................................... 439/271
   See application file for complete search history.

(56) References Cited

U.S. PATENT DOCUMENTS

| 4,684,190 | A | * | 8/1987 | Clark | ................. | H01R 13/5219 |
|           |   |   |        |       |                 | 439/277 |
| 4,968,044 | A | * | 11/1990 | Petrak | .................. | F16J 15/3204 |
|           |   |   |        |       |                 | 277/380 |
| 5,100,335 | A | * | 3/1992 | Yamamoto | ......... | H01R 13/5219 |
|           |   |   |        |       |                 | 439/271 |
| 5,158,391 | A | * | 10/1992 | Fujitani | .............. | H01R 13/5202 |
|           |   |   |        |       |                 | 403/288 |
| 5,389,005 | A | * | 2/1995 | Kodama | ............ | H01R 13/5219 |
|           |   |   |        |       |                 | 439/272 |

(Continued)

*Primary Examiner* — Abdullah A Riyami
*Assistant Examiner* — Vladimir Imas
(74) *Attorney, Agent, or Firm* — Cheng-Ju Chiang

(57) ABSTRACT

A waterproof sealing ring is applied to a waterproof connector. The waterproof connector is mounted to an electronic device which includes an enclosure. The waterproof sealing ring is attached to an outer surface of the enclosure. The enclosure defines an opening. The waterproof sealing ring includes a frame, and a connecting portion protruded outward and towards the enclosure from an outer peripheral surface of the frame. When the connecting portion is tightly attached to the outer surface of the enclosure, the connecting portion and the enclosure are combined with each other to form a combination space between the connecting portion and the enclosure. When fluid flows from the electronic device to the waterproof connector through the opening, the fluid flows through the combination space and generates an outward pressure on the connecting portion so as to make the connecting portion be under the outward pressure.

17 Claims, 10 Drawing Sheets

(56) References Cited

U.S. PATENT DOCUMENTS

| | | | | |
|---|---|---|---|---|
| 5,672,025 A * | 9/1997 | Yagi | ................... | H01R 13/5219 |
| | | | | 264/250 |
| 5,861,120 A * | 1/1999 | Yagi | ................... | H01R 13/5219 |
| | | | | 264/255 |
| 7,481,465 B2 * | 1/2009 | Gunderson | ......... | F16L 37/0987 |
| | | | | 285/319 |
| 8,167,634 B2 * | 5/2012 | Fujiwara | .............. | H01R 13/748 |
| | | | | 439/271 |
| 9,259,109 B2 * | 2/2016 | Samenuk | ............. | A47G 19/025 |
| 9,810,260 B2 * | 11/2017 | Tanigawa | ................ | F16C 33/20 |
| 10,312,628 B2 * | 6/2019 | Zhang | ............... | H01R 13/5216 |
| 10,468,812 B1 * | 11/2019 | Lee | ................... | H01R 13/2428 |
| 10,622,757 B2 * | 4/2020 | Kawashima | ......... | H01R 13/639 |

\* cited by examiner

WATERPROOF SEALING RING AND WATERPROOF CONNECTOR INCLUDING THE SAME

CROSS REFERENCE TO RELATED APPLICATION

The present application is based on, and claims priority from, China Patent Application No. 201922138988.9, filed Dec. 3, 2019, the disclosure of which is hereby incorporated by reference herein in its entirety.

BACKGROUND OF THE INVENTION

1. Field of the Invention

The present invention generally relates to a sealing ring and a waterproof connector, and more particularly to a waterproof sealing ring, and a waterproof connector including the waterproof sealing ring.

2. The Related Art

Currently, a conventional waterproof connector in prior art is sealed with an O-type or a special mountain-type sealing ring to realize a waterproof function, but a stepped sealing groove needs to be formed on a corresponding outer shell to be matched with the sealing ring. A sealing effect of the O-type sealing ring depends on a correct matching degree between a size of the O-type sealing ring and a size of the sealing groove, and a proper compression amount and a proper extension amount of the sealing ring are formed. If the compression amount of the O-type sealing ring is overly small, a leakage will be caused. If the compression amount is overly large, a rubber stress of the O-type sealing ring will be loosened to cause the leakage. In addition, if the O-type sealing ring is stretched excessively during work, the sealing ring will be also accelerated aging to cause the leakage.

Therefore, it is essential to provide a waterproof sealing ring, and a waterproof connector including the waterproof sealing ring, so that the waterproof sealing ring of the waterproof connector has a stable waterproof effect.

SUMMARY OF THE INVENTION

An object of the present invention is to provide a waterproof sealing ring applied to a waterproof connector. The waterproof connector includes a hollow shell. The waterproof sealing ring is mounted to the shell of the waterproof connector. The waterproof connector is mounted to an electronic device which includes an enclosure. The waterproof sealing ring is attached to an outer surface of the enclosure. The enclosure defines an opening longitudinally penetrating through a middle of the enclosure. The opening is connected with the shell through the waterproof sealing ring. The waterproof sealing ring includes a frame and a connecting portion. The connecting portion is protruded outward and towards the enclosure from an outer peripheral surface of the frame. When the connecting portion is tightly attached to the outer surface of the enclosure of the electronic device, the connecting portion and the enclosure are combined with each other to form a combination space between an inside of the connecting portion and the enclosure. When fluid flows from the electronic device to the waterproof connector through the opening, the fluid flows through the combination space and generates an outward pressure on the connecting portion so as to make the connecting portion be under the outward pressure provided by a flow of the fluid, and the connecting portion is closely attached to the enclosure. An outer peripheral wall of one end of the shell protrudes outward to form a fixing portion. The waterproof sealing ring is mounted to the fixing portion. The waterproof sealing ring is an elastic body which is integrally molded by an integral molding technology.

Another object of the present invention is to provide a waterproof sealing ring applied to a waterproof connector. The waterproof connector includes a hollow shell. The waterproof sealing ring is mounted to the shell of the waterproof connector. The waterproof connector is mounted to an electronic device which includes an enclosure. The waterproof sealing ring is attached to an outer surface of the enclosure. The enclosure defines an opening longitudinally penetrating through a middle of the enclosure. The opening is connected with the shell through the waterproof sealing ring. The waterproof sealing ring includes a frame, and a hollow connecting portion protruded outward and towards the enclosure from a root portion of an inner peripheral surface of the frame. A rear of an outer periphery of the waterproof sealing ring has a limiting portion protruded outward and towards the enclosure. When the connecting portion is tightly attached to the outer surface of the enclosure of the electronic device, the enclosure covers an inside of the connecting portion to form a combination space between the enclosure and the inside of the connecting portion. When fluid flows from the electronic device to the shell of the waterproof connector through the opening. The fluid flows into the combination space. The fluid generates an outward pressure exerted on an inner surface of a peripheral wall of the hollow connecting portion to make the connecting portion propped outward, and the limiting portion elastically supports against the connecting portion which is propped outward. The limiting portion, the connecting portion and the enclosure are made to form a sealing effect among the waterproof connector, the waterproof sealing ring and the enclosure. An outer peripheral wall of one end of the shell protrudes outward to form a fixing portion. The waterproof sealing ring is mounted to the fixing portion. The waterproof sealing ring is an elastic body which is integrally molded by an integral molding technology.

Another object of the present invention is to provide a waterproof connector. The waterproof connector includes a shell, and a waterproof sealing ring mounted to a rear end of the shell. The waterproof sealing ring includes a frame mounted to the rear end of the shell, and a connecting portion protruded rearward from the frame. The connecting portion is gradually expanded outward or gradually shrinked inward from the frame.

As described above, the waterproof sealing ring is provided with the connecting portion and the combination space, the fluid flows into the combination space of the inside of the connecting portion, at the moment, the fluid generates the outward pressure exerted on the inner surface of the peripheral wall of the hollow connecting portion to make the connecting portion propped outward, in this way, the connecting portion is more closely attached to the outer surface of the enclosure of the electronic device by virtue of the fluid pushing against the connecting portion outward, so that the better sealing effect among the waterproof connector, the waterproof sealing ring and the enclosure of the electronic device is reached so as to prevent the fluid from being leaked out. As a result, an outside of the waterproof connector cooperates with the enclosure of the electronic device to ensure and enhance a normal waterproof function.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
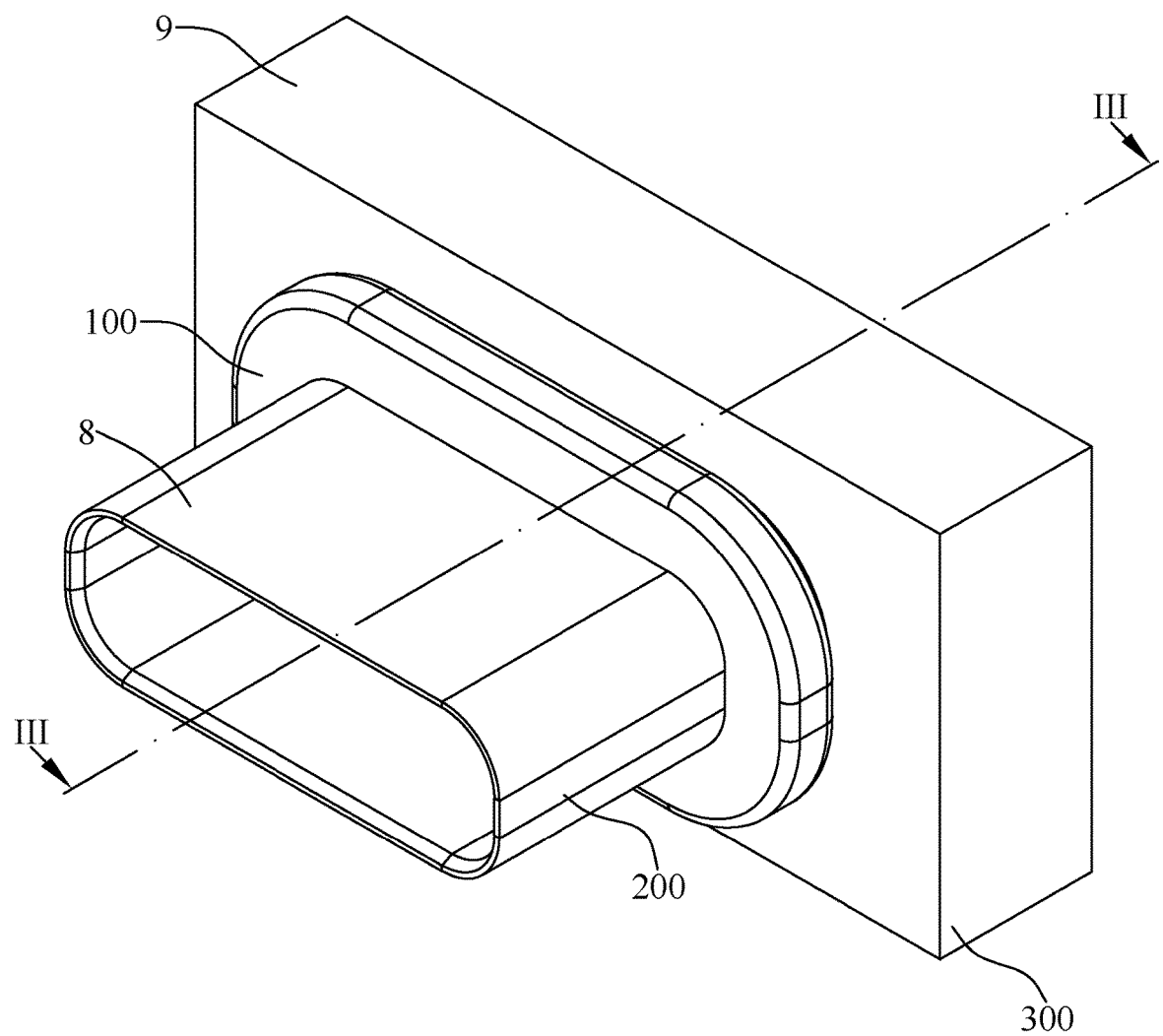
FIG. 1 is a perspective view of a waterproof sealing ring and a waterproof connector which includes the waterproof sealing ring in accordance with a first preferred embodiment of the present invention, wherein the waterproof sealing ring of the waterproof connector is disposed between the waterproof connector and an electronic device.
Figure 2:
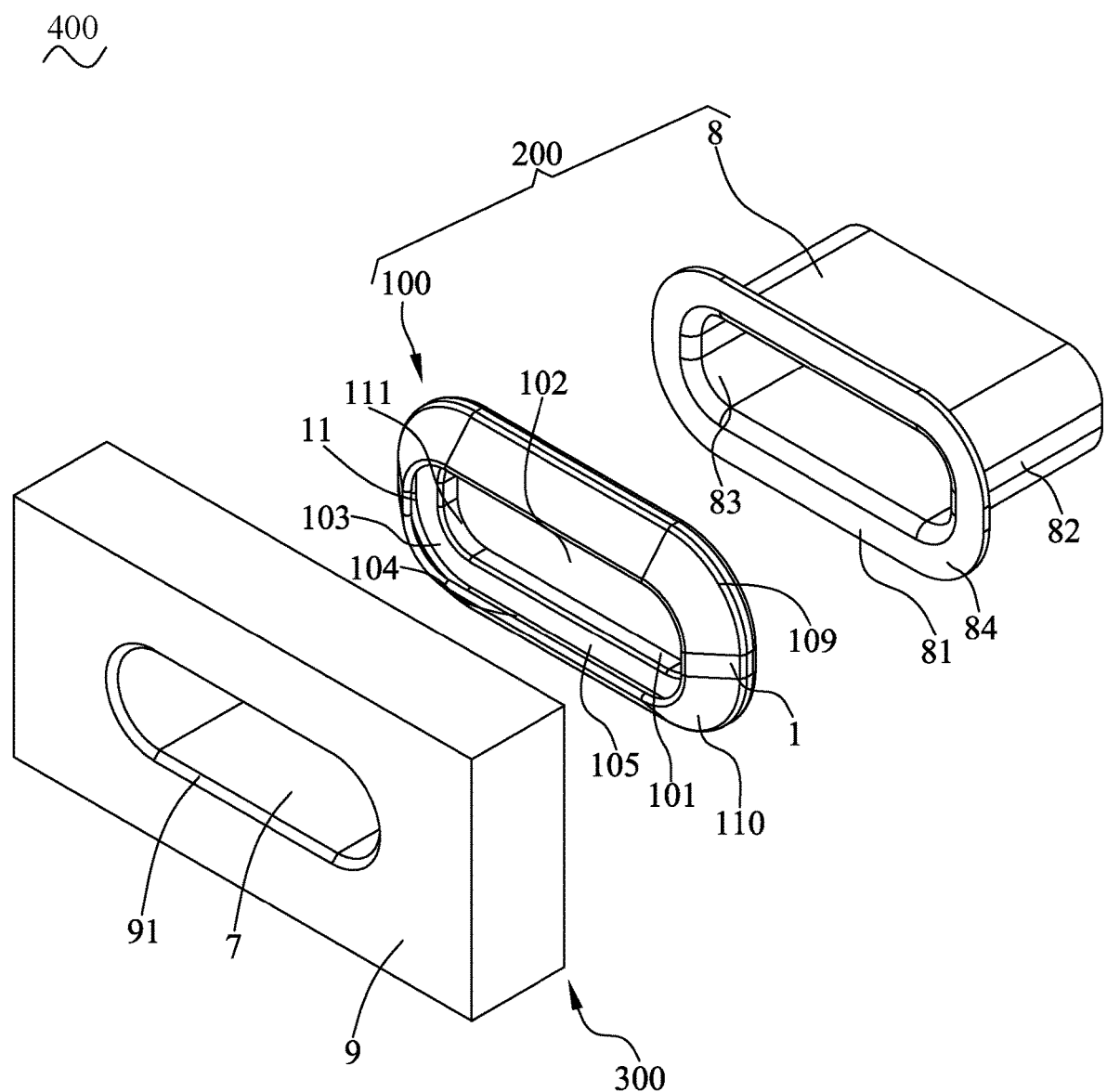
FIG. 2 is an exploded perspective view showing that the waterproof sealing ring of the waterproof connector, the waterproof connector and the electronic device in accordance with the first preferred embodiment of the present invention of FIG. 1.
Figure 3:
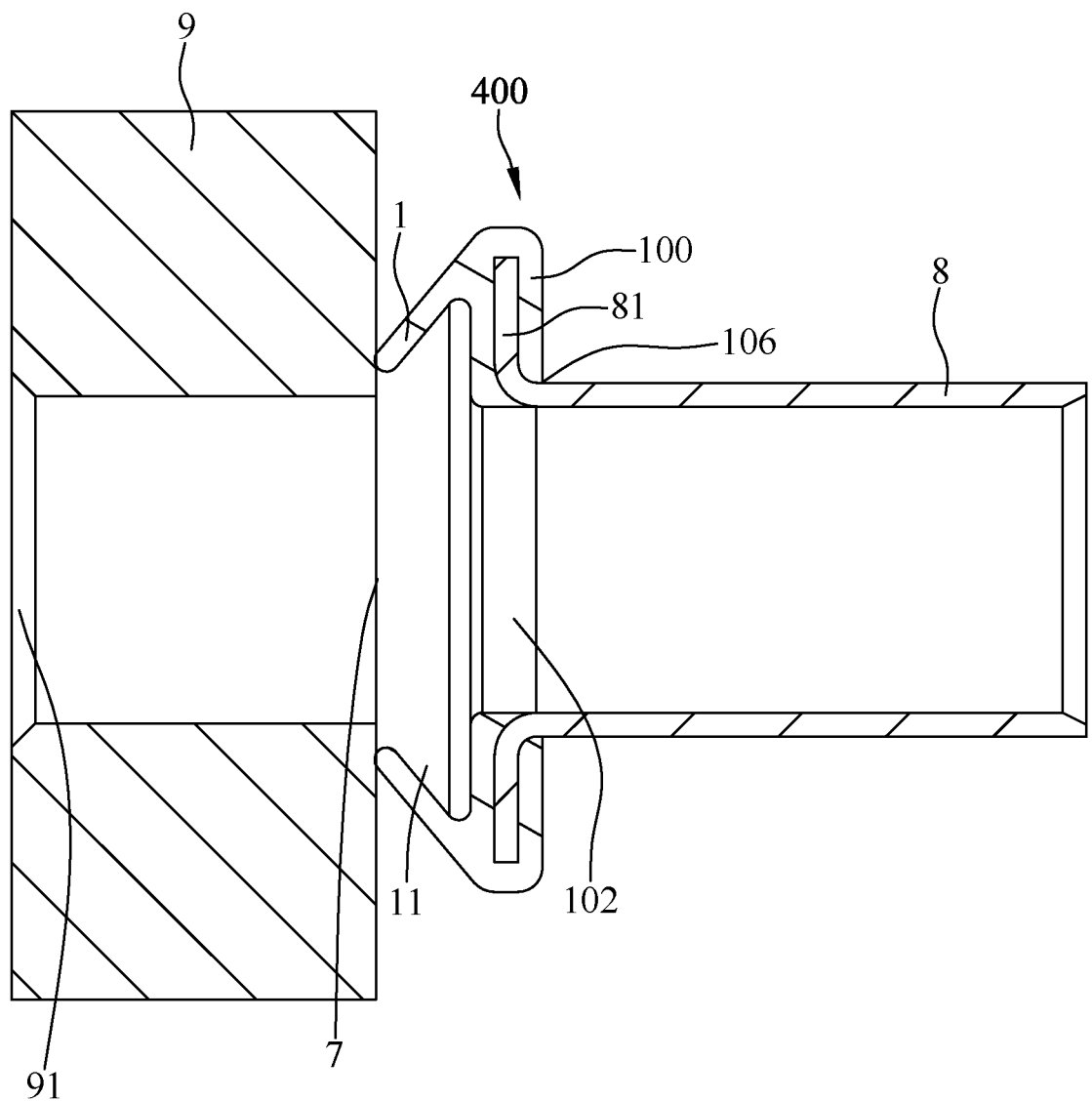
FIG. 3 is a cross-section view showing that the waterproof sealing ring of the waterproof connector is disposed between the waterproof connector and the electronic device along a line of FIG. 1.
Figure 4:
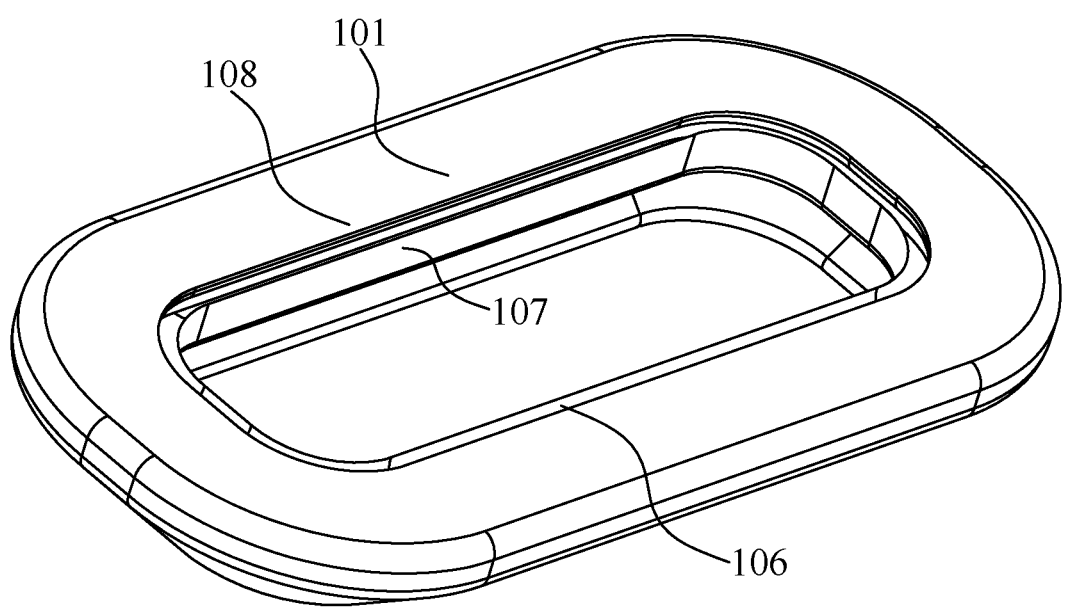
FIG. 4 is a perspective view of the waterproof sealing ring of the waterproof connector of FIG. 1.
Figure 5:
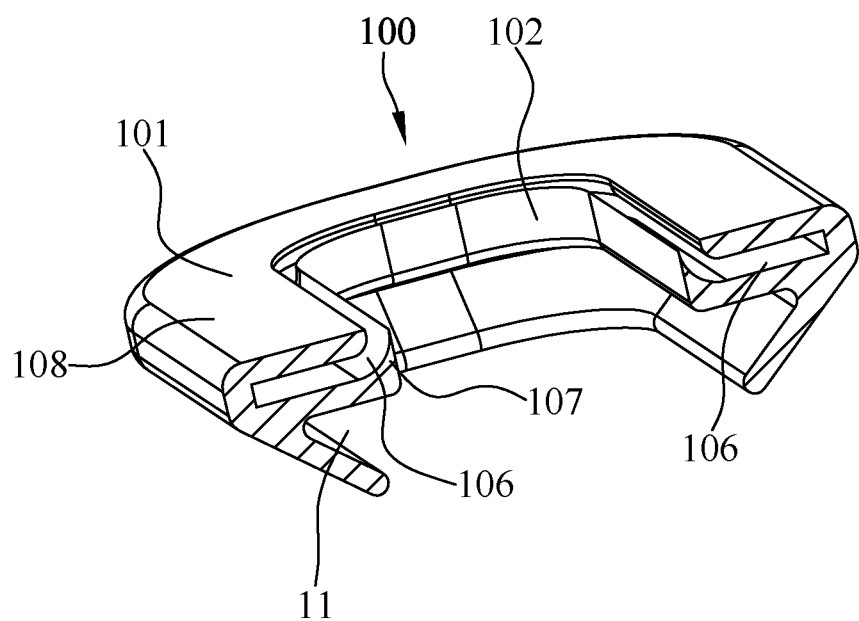
FIG. 5 is a sectional view of the waterproof sealing ring of the waterproof connector of FIG. 4.
Figure 6:
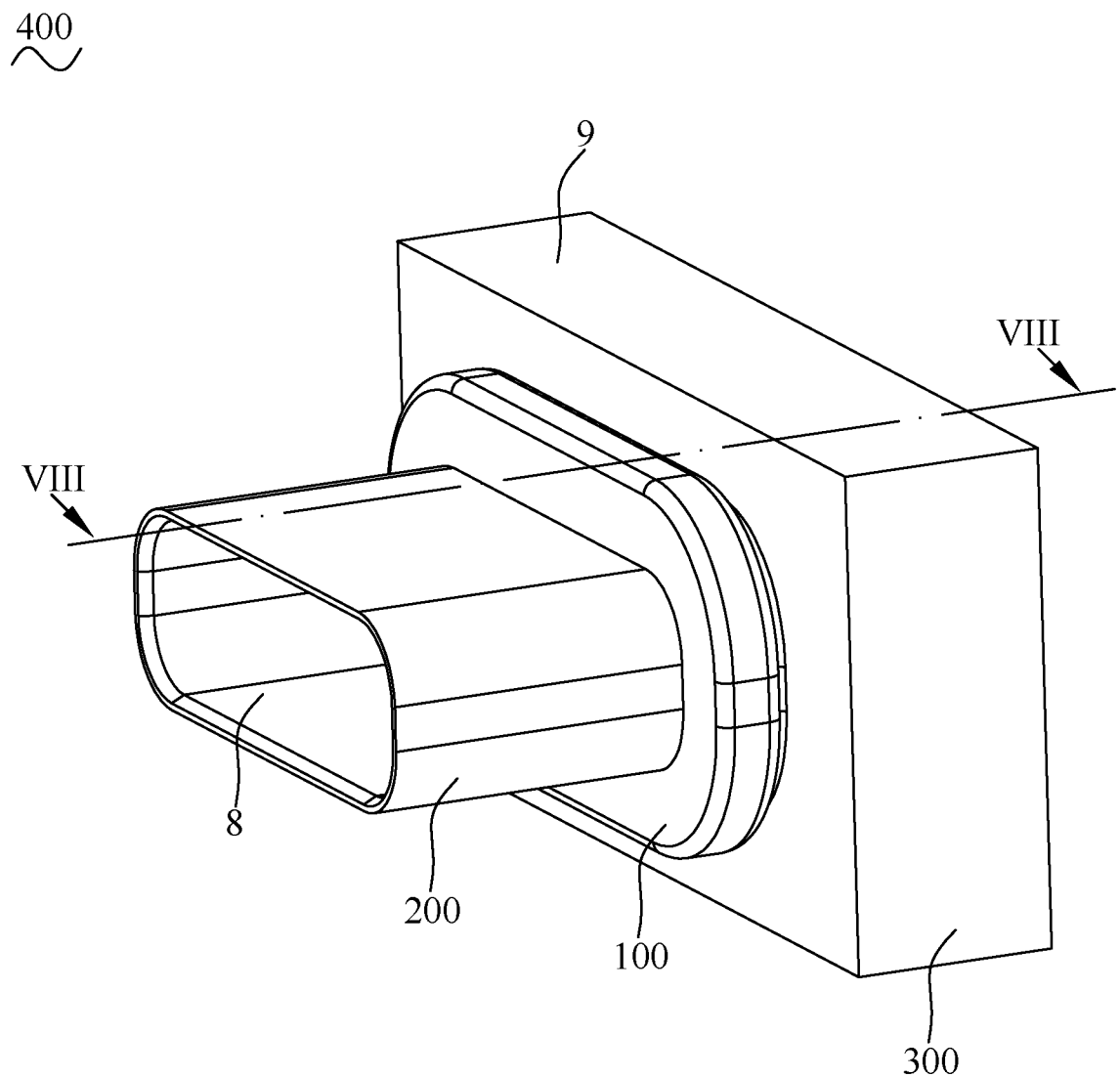
FIG. 6 is a perspective view of the waterproof sealing ring and the waterproof connector which includes the waterproof sealing ring in accordance with a second preferred embodiment of the present invention, wherein the waterproof sealing ring of the waterproof connector is disposed between the waterproof connector and the electronic device.
Figure 7:
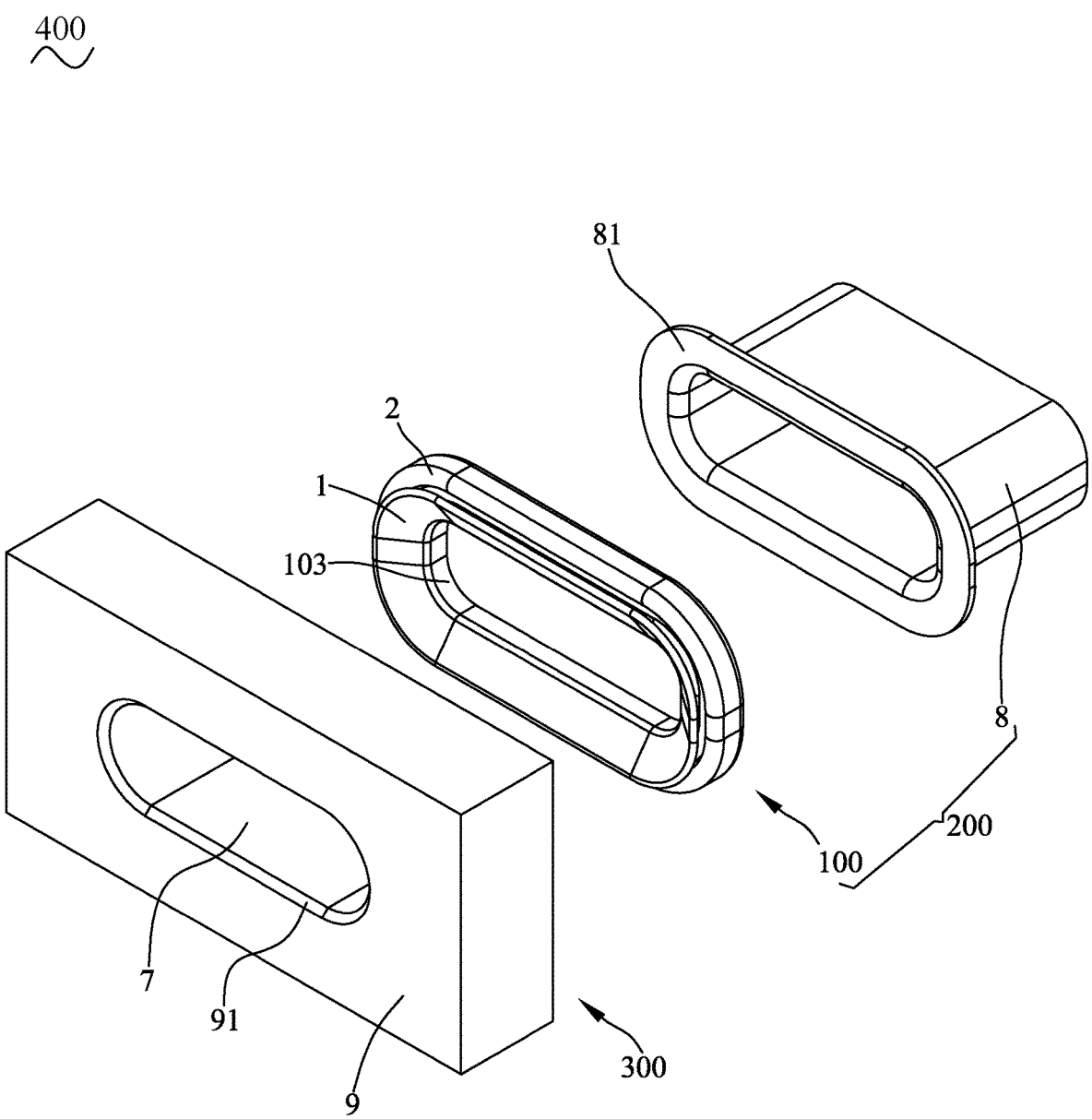
FIG. 7 is an exploded perspective view showing that the waterproof sealing ring of the waterproof connector, the waterproof connector and the electronic device in accordance with the second preferred embodiment of the present invention of FIG. 6.
Figure 8:
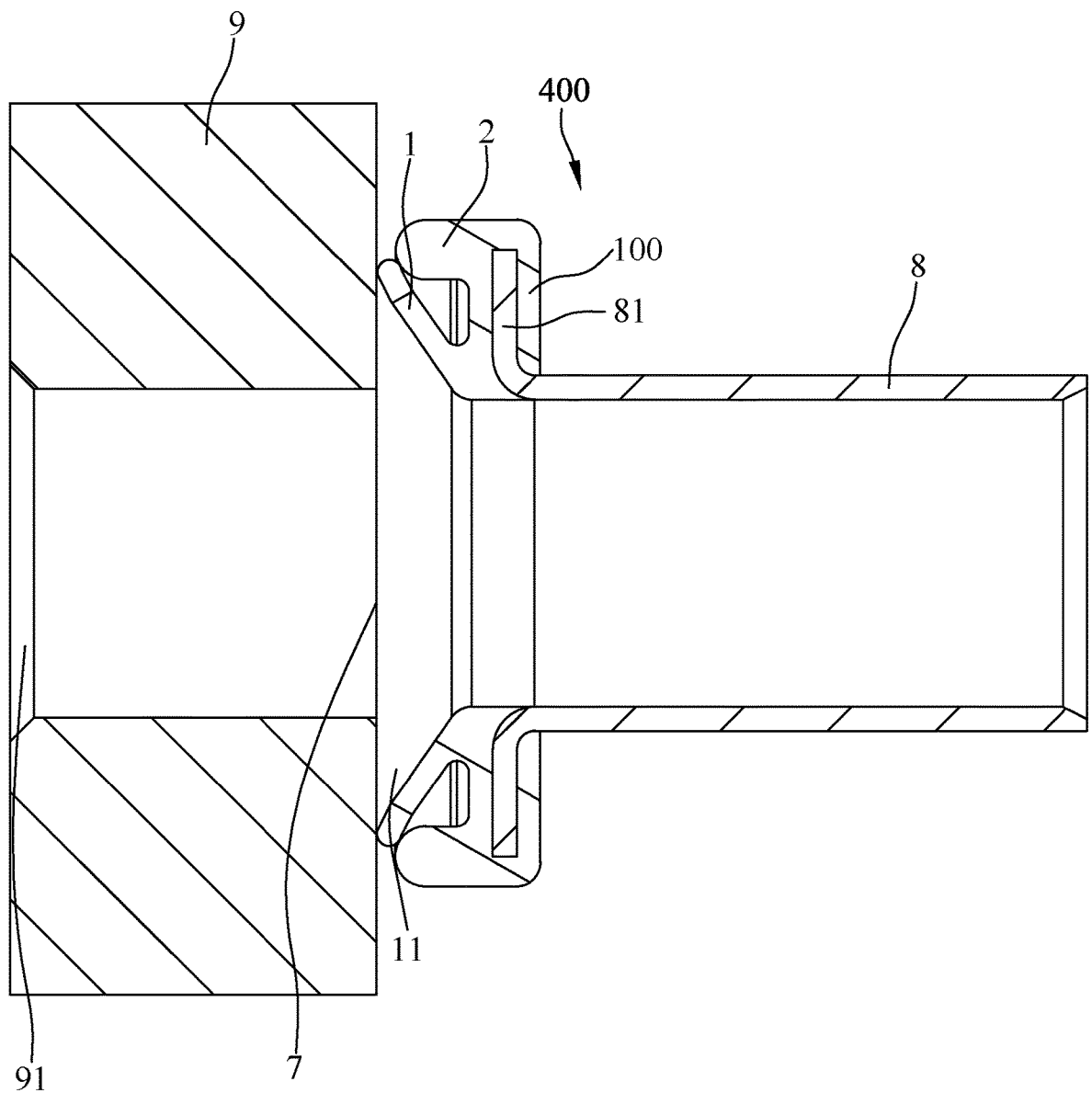
FIG. 8 is a cross-section view showing that the waterproof sealing ring of the waterproof connector is disposed between the waterproof connector and the electronic device along a line VIII-VIII of FIG. 6.
Figure 9:
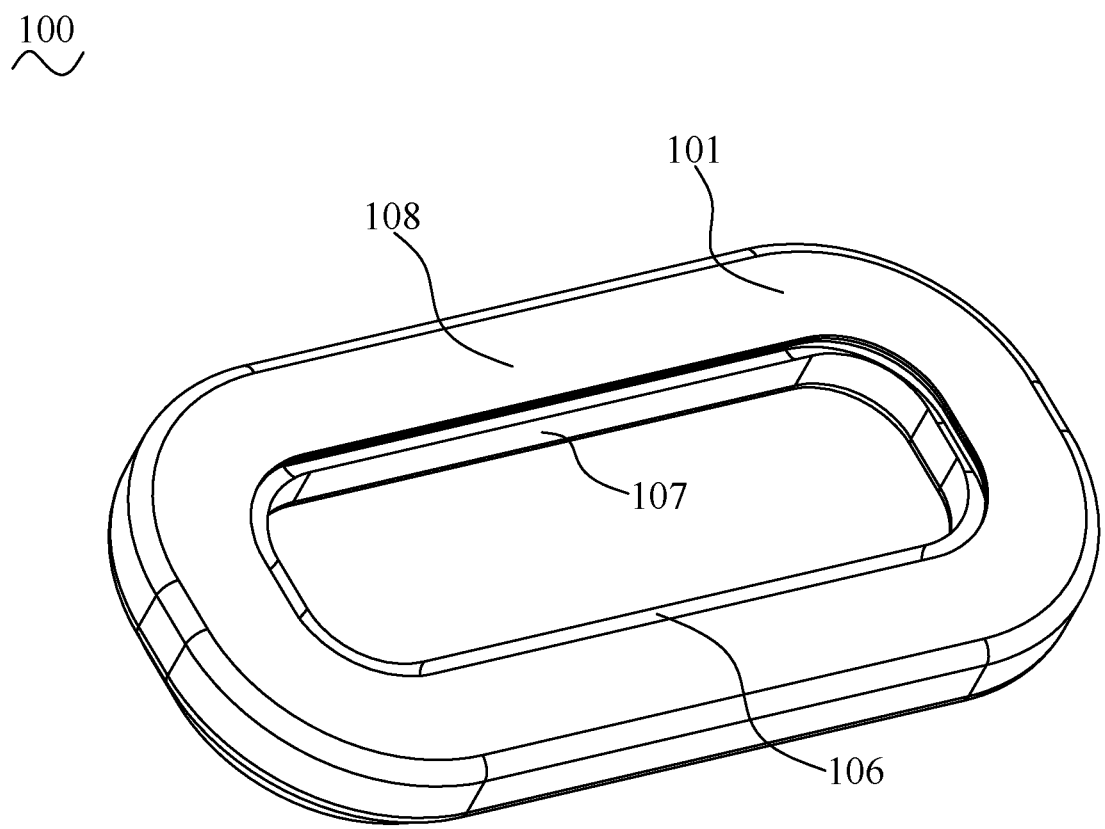
FIG. 9 is a perspective view of the waterproof sealing ring of the waterproof connector of FIG. 6.
Figure 10:
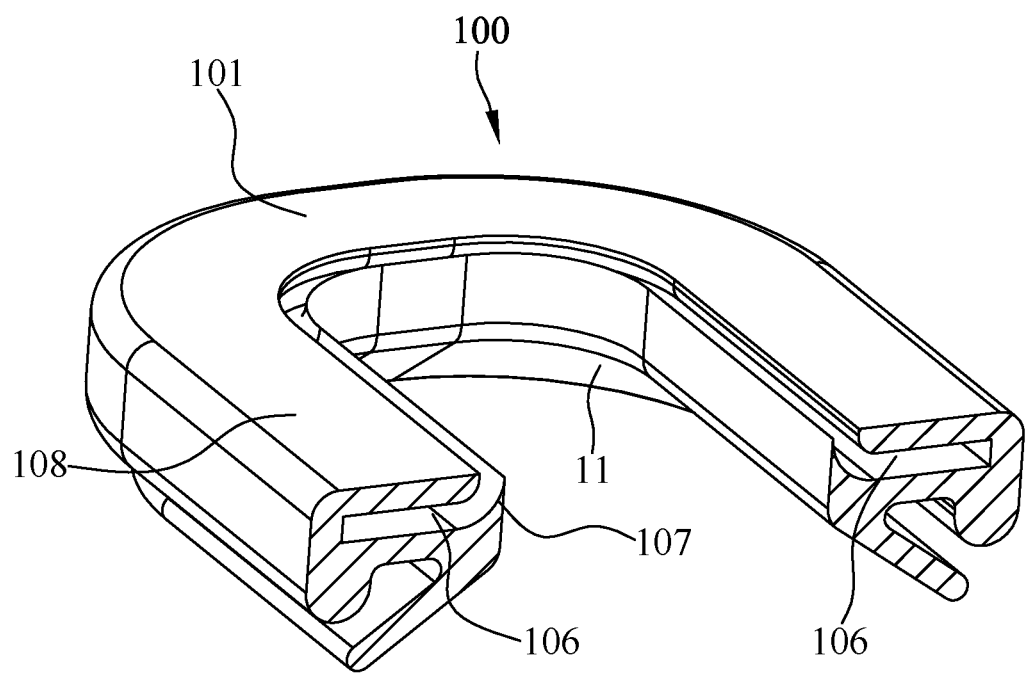
FIG. 10 is a sectional view of the waterproof sealing ring of the waterproof connector of FIG. 9.

With reference to FIG. 1 to FIG. 10, a waterproof sealing ring 100 and a waterproof connector 200 in accordance with a first preferred embodiment and a second preferred embodiment of the present invention are shown. The waterproof sealing ring 100 is applied to the waterproof connector 200. The waterproof connector 200 includes the waterproof sealing ring 100 and a hollow shell 8. The waterproof sealing ring 100 is applied in a waterproof sealing assembly 400. The waterproof sealing ring 100 is mounted to the shell 8 of the waterproof connector 200. The waterproof connector 200 is mounted to an electronic device 300. The electronic device 300 includes an enclosure 9. The waterproof sealing ring 100 is disposed to the shell 8 and is tightly attached to an outer surface of the enclosure 9. The waterproof sealing ring 100 is fastened between the shell 8 and the outer surface of the enclosure 9. The waterproof sealing assembly 400 includes the waterproof sealing ring 100, the waterproof connector 200 and the electronic device 300.

The waterproof sealing ring 100 is mounted to one end of the shell 8 of the waterproof connector 200, and is combined with the outer surface of the enclosure 9 of the electronic device 300 facing the waterproof sealing ring 100. The waterproof sealing ring 100 is mounted to a rear end of the shell 8. In the first preferred embodiment and the second preferred embodiment, the waterproof sealing ring 100 is tightly attached to a front surface of the enclosure 9. The waterproof sealing ring 100 is combined with the front surface of the enclosure 9 of the electronic device 300 facing the waterproof sealing ring 100.

The enclosure 9 of the electronic device 300 defines an opening 7 longitudinally penetrating through a middle of the enclosure 9. A peripheral wall of the opening 7 is connected with the one end of the shell 8 of the waterproof connector 200 through the waterproof sealing ring 100. An outer peripheral wall of the one end of the shell 8 protrudes outward to form a ring-shaped fixing portion 81. The shell 8 has a hollow base portion 82, and the base portion 82 is substantially rectangular. The base portion 82 has four rounded interior corners 83. An outer peripheral wall of a rear end of the base portion 82 protrudes outward to form the ring-shaped fixing portion 81. The fixing portion 81 is shown as a rectangular ring shape. The fixing portion 81 has four rounded exterior corners 84. The four rounded interior corners 83 are matched with four second internal rounded corners 111 of the waterproof sealing ring 100. The four rounded exterior corners 84 are matched with four second external rounded corners 109 of the waterproof sealing ring 100.

The waterproof sealing ring 100 is mounted to the fixing portion 81. The waterproof sealing ring 100 is an elastic body which is integrally molded by an integral molding technology. The waterproof sealing ring 100 is molded to the shell 8. The waterproof sealing ring 100 is mounted around the fixing portion 81. A middle of a rear surface of the enclosure 9 is recessed frontward to form a ring-shaped recess 91 around a rear end of the opening 7. An inner surface of a peripheral wall of the recess 91 slantwise extends outward from front to rear.

Referring to FIG. 1 to FIG. 5, the waterproof sealing ring 100 in accordance with the first preferred embodiment of the present invention is shown in FIG. 1 to FIG. 5. The waterproof sealing ring 100 has a frame 101 and a hollow connecting portion 1. In the present invention, the connecting portion 1 is gradually expanded outward or gradually shrinked inward from the frame 101. The frame 101 is of a rectangular shape. The frame 101 is mounted to the rear end of the shell 8. The connecting portion 1 is of a hollow ring shape. A middle of the frame 101 defines a rectangular accommodating space 102 longitudinally penetrating through the middle of the frame 101. An inner periphery of a front surface of the frame 101 is recessed rearward and then extends outward to form a ring-shaped limiting groove 106. The limiting groove 106 is shown as the rectangular ring shape and is matched with the fixing portion 81. The fixing portion 81 is molded in the limiting groove 106 of the frame 101. The base portion 82 is exposed outside of the limiting groove 106. An outer peripheral wall 108 and an inner peripheral wall 107 of the limiting groove 106 clamp the rear end of the base portion 82.

An inner peripheral surface of the connecting portion 1 has four first internal rounded corners 103. An outer peripheral surface of the connecting portion 1 has four first external rounded corners 110. The inner peripheral surface of the frame 101 has the four second internal rounded corners 111. An outer peripheral surface of the frame 101 has the four second external rounded corners 109. The inner peripheral surface and the outer peripheral surface of the frame 101 are rectangular. An inner surface of a peripheral wall of the accommodating space 102 is the rectangular shape. The hollow connecting portion 1 is protruded outward and towards the enclosure 9 from the outer peripheral surface of the frame 101. In the first preferred embodiment, a periphery of a rear surface of the frame 101 protrudes rearward towards the enclosure 9 to form the connecting portion 1. A peripheral wall of the connecting portion 1 gradually shrinks inward from front to rear. A middle of a rear of the connecting portion 1 defines a connecting space 104. The peripheral wall of the connecting portion 1 is spaced from the frame 101 to form a receiving space 105. The connecting space 104 is communicated with the accommodating space 102 through the receiving space 105, so the receiving space 105 is connected between and communicated with the accommodating space 102 and the connecting space 104.

Referring to FIG. 1 to FIG. 5, when the connecting portion 1 is tightly attached to the outer surface of the enclosure 9 of the electronic device 300, namely the connecting portion 1 is tightly attached to the front surface of the enclosure 9 of the electronic device 300, the connecting portion 1 and the enclosure 9 are combined with each other to form a combination space 11 between an inside of the connecting portion 1 and the enclosure 9. An inner peripheral surface of the combination space 11 has the four first internal rounded corners 103. Specifically, a rear surface of the hollow connecting portion 1 is attached to the front surface of the enclosure 9 to form the combination space 11 between the front surface of the enclosure 9 and the connecting portion 1. The combination space 11 includes the connecting space 104 and the receiving space 105. When fluid flows from the electronic device 300 to the waterproof connector 200 through the opening 7, the fluid flows through the connecting space 104 and the receiving space 105 of the combination space 11 and generates an outward pressure on the connecting portion 1 so as to make the connecting portion 1 be under the outward pressure provided by a flow of the fluid, and the connecting portion 1 is closely attached to the enclosure 9 to prevent the fluid from leaking out.

With reference to FIG. 1 to FIG. 5 again, in the first preferred embodiment, an outermost surface of the waterproof sealing ring 100 protrudes outward and towards the enclosure 9, and gradually shrinks inward and towards a center of the waterproof sealing ring 100 to form the connecting portion 1. Specifically, the periphery of the rear surface of the frame 101 protrudes rearward and gradually shrinks inward to form the connecting portion 1. The connecting portion 1 is attached to the outer surface of the enclosure 9 of the electronic device 300. The connecting portion 1 and the enclosure 9 are combined with each other to make the enclosure 9 cover the inside of the connecting portion 1 to form the combination space 11 between the inside of the connecting portion 1 and the enclosure 9. The connecting portion 1 of the waterproof sealing ring 100 is a part of the elastic body which is integrally molded by the integral molding technology. The connecting portion 1 has an elastic arm characteristic which is integrally molded by the integral molding technology. The connecting portion 1 swings outward or swings inward and project into the combination space 11 due to actions of the combination space 11 and the accommodating space 102.

When the waterproof connector 200 and the electronic device 300 are assembled, the waterproof sealing ring 100 is connected between the waterproof connector 200 and the electronic device 300, and specifically, the waterproof sealing ring 100 is located at an assembling place between the waterproof connector 200 and the electronic device 300. Because the connecting portion 1 is attached to the outer surface of the enclosure 9 of the electronic device 300, when the fluid flows from the electronic device 300 to the waterproof connector 200 through the opening 7, the fluid will flow into the combination space 11 of the inside of the connecting portion 1. At the moment, the fluid will generate the outward pressure exerted on an inner surface of the peripheral wall of the hollow ring-shaped connecting portion 1 to make the connecting portion 1 propped outward, in this way, the connecting portion 1 will be in contact with the outer surface of the enclosure 9 of the electronic device 300, and the connecting portion 1 is more closely attached to the outer surface of the enclosure 9 of the electronic device 300 by virtue of the fluid pushing against the connecting portion 1 outward, thereby a position where the connecting portion 1 of the waterproof sealing ring 100 is attached with the outer surface of the enclosure 9 of the electronic device 300 achieves a better sealing effect among the waterproof connector 200, the waterproof sealing ring 100 and the enclosure 9 of the electronic device 300 the shell 8 is used in a deep extraction and the waterproof sealing ring 100 is a waterproof layer, so as to prevent the fluid from being leaked out.

With reference to FIG. 1 to FIG. 10, the waterproof sealing ring 100 in accordance with a second preferred embodiment of the present invention is shown in FIG. 6 to FIG. 10. Differences between the waterproof sealing ring 100 in accordance with the first preferred embodiment and the waterproof sealing ring 100 in accordance with the second preferred embodiment are described as follows. In the second preferred embodiment, the connecting portion 1 is protruded outward and towards the enclosure 9 from a root portion of the inner peripheral surface of the frame 101, and the connecting portion 1 is gradually expanded outward from front to rear. The front surface of the enclosure 9 covers the inside of the connecting portion 1 to form the sealing combination space 11 between the front surface of the enclosure 9 and the inside of the connecting portion 1. A rear of an outer periphery of the waterproof sealing ring 100 has a ring-shaped limiting portion 2 protruded outward and towards the enclosure 9. The connecting portion 1 gradually expands outward from the frame 101, and the frame 101 of the waterproof sealing ring 100 has the limiting portion 2 protruded rearward. An outer periphery of the rear surface of the frame 101 protrudes rearward and towards the enclosure 9 to form the ring-shaped limiting portion 2. The limiting portion 2 is located at an outer periphery of the waterproof sealing ring 100. The limiting portion 2 is disposed to an outer periphery of the connecting portion 1. The limiting portion 2 is positioned outside the connecting portion 1 along a peripheral direction of the frame 101. The limiting portion 2 is spaced from the connecting portion 1. The limiting portion 2 of the waterproof sealing ring 100 is another part of the elastic body which is integrally molded by the integral molding technology.

When the waterproof connector 200 and the electronic device 300 are connected with each other, the waterproof sealing ring 100 is located at a position where the opening 7 of the enclosure is connected with the waterproof sealing ring 100. Specifically, the waterproof sealing ring 100 is connected with the peripheral wall of the opening 7. Because the connecting portion 1 is attached to the outer surface of the enclosure 9 of the electronic device 300, when the fluid flows from the electronic device 300 to the shell 8 of the waterproof connector 200 through the opening 7, the fluid flows into the combination space 11 of the inside of the connecting portion 1, at the moment, the fluid generates the outward pressure exerted on the inner surface of the peripheral wall of the hollow ring-shaped connecting portion 1 to make the connecting portion 1 propped outward, and the limiting portion 2 elastically supports against the connecting portion 1 which is propped outward to limit a swing amplitude of the connecting portion 1, so the connecting portion 1 is prevented from being overly pressed to cause an elastic function failure, in this way, the connecting portion 1 will be in contact with the outer surface of the enclosure 9 of the electronic device 300, and the connecting portion 1 is more closely attached to the outer surface of the enclosure 9 of the electronic device 300 by virtue of the fluid pushing against the connecting portion 1 outward, thereby the position where the connecting portion 1 of the waterproof sealing ring 100 is attached with the outer surface of the enclosure 9 of the electronic device 300 achieves the sealing effect, correspondingly the limiting portion 2, the connecting portion 1 and the enclosure 9 of the electronic device 300 are made to form the better sealing effect among the waterproof connector 200, the waterproof sealing ring 100 and the enclosure 9 of the electronic device 300, so that the fluid is prevented from being leaked out.

As described above, the waterproof sealing ring 100 is provided with the connecting portion 1 and the combination space 11, the fluid flows into the combination space 11 of the inside of the connecting portion 1, at the moment, the fluid generates the outward pressure exerted on the inner surface of the peripheral wall of the hollow ring-shaped connecting portion 1 to make the connecting portion 1 propped outward, in this way, the connecting portion 1 is more closely attached to the outer surface of the enclosure 9 of the electronic device 300 by virtue of the fluid pushing against the connecting portion 1 outward, so that the better sealing effect among the waterproof connector 200, the waterproof sealing ring 100 and the enclosure 9 of the electronic device 300 is reached so as to prevent the fluid from being leaked out. As a result, an outside of the waterproof connector 200 cooperates with the enclosure 9 of the electronic device 300 to ensure and enhance a normal waterproof function.

Descriptions disclosed above are just preferred embodiments of the present invention, definitely, an extent of a patent protection of the present invention is unable to be limited under the above-mentioned descriptions, so an equivalent change made according to the extent of the patent protection of the present invention still belongs to a covering range of the present invention.

What is claimed is:

1. A waterproof sealing ring applied to a waterproof connector, the waterproof connector including a hollow shell, the waterproof sealing ring being mounted to the shell of the waterproof connector, the waterproof connector being mounted to an electronic device which includes an enclosure, the waterproof sealing ring being attached to an outer surface of the enclosure, the enclosure defining an opening longitudinally penetrating through a middle of the enclosure, the opening being connected with the shell through the waterproof sealing ring, the waterproof sealing ring comprising:

a frame; and a connecting portion protruded outward and towards the enclosure from an outer peripheral surface of the frame, when the connecting portion is tightly attached to the outer surface of the enclosure of the electronic device, the connecting portion and the enclosure being combined with each other to form a combination space between an inside of the connecting portion and the enclosure, when fluid flows from the electronic device to the waterproof connector through the opening, the fluid flowing through the combination space and generating an outward pressure on the connecting portion so as to make the connecting portion be under the outward pressure provided by a flow of the fluid, and the connecting portion being closely attached to the enclosure;

wherein an outer peripheral wall of one end of the shell protrudes outward to form a fixing portion, the waterproof sealing ring is mounted to the fixing portion, the waterproof sealing ring is an elastic body which is integrally molded by an integral molding technology.

2. The waterproof sealing ring as claimed in claim 1, wherein an outermost surface of the waterproof sealing ring protrudes outward and towards the enclosure, and gradually shrinks inward and towards a center of the waterproof sealing ring to form the connecting portion, the connecting portion of the waterproof sealing ring is a part of the elastic body which is integrally molded by the integral molding technology.

3. The waterproof sealing ring as claimed in claim 1, wherein the connecting portion is of a hollow ring shape, a rear surface of the hollow connecting portion is attached to a front surface of the enclosure to form the combination space between the front surface of the enclosure and the connecting portion.

4. The waterproof sealing ring as claimed in claim 1, wherein an inner peripheral surface of the connecting portion has four first internal rounded corners, an outer peripheral surface of the connecting portion has four first external rounded corners, an inner peripheral surface of the frame has four second internal rounded corners, an outer peripheral surface of the frame has four second external rounded corners.

5. The waterproof sealing ring as claimed in claim 4, wherein the shell has a hollow base portion which is substantially rectangular, the base portion has four rounded interior corners, an outer peripheral wall of a rear end of the base portion protrudes outward to form the fixing portion which is shown as a rectangular ring shape, the fixing portion has four rounded exterior corners, the inner peripheral surface and the outer peripheral surface of the frame are rectangular, the four rounded interior corners are matched with the four second internal rounded corners, the four rounded exterior corners are matched with the four second external rounded corners.

6. The waterproof sealing ring as claimed in claim 5, wherein a middle of the frame defines a rectangular accommodating space longitudinally penetrating through the middle of the frame, an inner periphery of a front surface of the frame is recessed rearward and then extends outward to form a ring-shaped limiting groove, the limiting groove is shown as the rectangular ring shape and is matched with the fixing portion, the fixing portion is molded in the limiting groove, the base portion is exposed outside of the limiting groove, an outer peripheral wall and an inner peripheral wall of the limiting groove clamp the rear end of the base portion.

7. The waterproof sealing ring as claimed in claim 6, wherein a middle of a rear of the connecting portion defines a connecting space, a peripheral wall of the connecting portion is spaced from the frame to form a receiving space, the connecting space is communicated with the accommodating space through the receiving space, so the receiving space is connected between and communicated with the accommodating space and the connecting space.

8. The waterproof sealing ring as claimed in claim 7, wherein the combination space includes the connecting space and the receiving space.

9. The waterproof sealing ring as claimed in claim 7, wherein the connecting portion has an elastic arm characteristic which is integrally molded by the integral molding technology, the connecting portion swings outward or swings inward and project into the combination space due to actions of the combination space and the accommodating space.

10. The waterproof sealing ring as claimed in claim 1, wherein the waterproof sealing ring is applied in a waterproof sealing assembly, the waterproof sealing assembly includes the waterproof sealing ring, the waterproof connector and the electronic device.

11. A waterproof sealing ring applied to a waterproof connector, the waterproof connector including a hollow shell, the waterproof sealing ring being mounted to the shell of the waterproof connector, the waterproof connector being mounted to an electronic device which includes an enclosure, the waterproof sealing ring being attached to an outer surface of the enclosure, the enclosure defining an opening longitudinally penetrating through a middle of the enclosure, the opening being connected with the shell through the waterproof sealing ring, the waterproof sealing ring comprising:
a frame; and
a hollow connecting portion protruded outward and towards the enclosure from a root portion of an inner peripheral surface of the frame, a rear of an outer periphery of the waterproof sealing ring having a limiting portion protruded outward and towards the enclosure, when the connecting portion is tightly attached to the outer surface of the enclosure of the electronic device, the enclosure covering an inside of the connecting portion to form a combination space between the enclosure and the inside of the connecting portion, when fluid flows from the electronic device to the shell of the waterproof connector through the opening, the fluid flowing into the combination space, the fluid generating an outward pressure exerted on an inner surface of a peripheral wall of the hollow connecting portion to make the connecting portion propped outward, and the limiting portion elastically supporting against the connecting portion which is propped outward, the limiting portion, the connecting portion and the enclosure being made to form a sealing effect among the waterproof connector, the waterproof sealing ring and the enclosure;
wherein an outer peripheral wall of one end of the shell protrudes outward to form a fixing portion, the waterproof sealing ring is mounted to the fixing portion, the waterproof sealing ring is an elastic body which is integrally molded by an integral molding technology.

12. The waterproof sealing ring as claimed in claim 11, wherein a front surface of the enclosure covers the inside of the connecting portion to form the sealing combination space between the front surface of the enclosure and the inside of the connecting portion, the limiting portion is located at an outer periphery of the waterproof sealing ring.

13. The waterproof sealing ring as claimed in claim 11, wherein the connecting portion is gradually expanded outward from front to rear, an outer periphery of a rear surface of the frame protrudes rearward and towards the enclosure to form the ring-shaped limiting portion, the limiting portion is disposed to an outer periphery of the connecting portion.

14. A waterproof connector, comprising:
a shell; and
a waterproof sealing ring mounted to a rear end of the shell, the waterproof sealing ring comprising:
a frame mounted to the rear end of the shell; and
a connecting portion being mounted to an electronic device;
wherein the electronic device includes an enclosure which defines an opening longitudinally penetrating through a middle of the enclosure, the waterproof sealing ring is attached to an outer surface of the enclosure, the opening is connected with the shell through the waterproof sealing ring, the waterproof sealing ring is an elastic body which is integrally molded by an integral molding technology;
wherein the connecting portion is protruded outward and towards the enclosure from an outer peripheral surface of the frame, a peripheral wall of the connecting portion gradually shrinks inward from front to rear, when the connecting portion is tightly attached to the outer surface of the enclosure, the connecting portion and the enclosure are combined with each other to form a combination space between an inside of the connecting portion and the enclosure, when fluid flows from the electronic device to the waterproof connector through the opening, the fluid flows through the combination space and generates an outward pressure on the connecting portion so as to make the connecting portion be under the outward pressure provided by a flow of the fluid.

15. The waterproof connector as claimed in claim 14, wherein an outer peripheral wall of the rear end of the shell protrudes outward to form a fixing portion, the waterproof sealing ring is mounted to the fixing portion.

16. The waterproof connector as claimed in claim 15, wherein an inner periphery of a front surface of the frame is recessed rearward and then extends outward to form a ring-shaped limiting groove, the limiting groove is shown as a rectangular ring shape and is matched with the fixing portion, the fixing portion is molded in the limiting groove.

17. The waterproof connector as claimed in claim 16, wherein the connecting portion gradually expands outward from the frame and the frame of the waterproof sealing ring has a limiting portion protruded rearward, the limiting portion is positioned outside the connecting portion along a peripheral direction of the frame.

* * * * *